June 8, 1965 R. A. STRAIGHT ETAL 3,188,251

METHOD FOR MAKING SEMICONDUCTOR JUNCTION DEVICES

Filed Jan. 19, 1962

INVENTORS
RONALD A. STRAIGHT &
WALTER P. ALINA
BY
W. S. Hill
AGENT

United States Patent Office 3,188,251

Patented June 8, 1965

3,188,251

METHOD FOR MAKING SEMICONDUCTOR JUNCTION DEVICES

Ronald A. Straight, Mountainside, and Walter P. Alina, Fords, N.J., assignors to Radio Corporation of America, a corporation of Delaware Filed Jan. 19, 1962, Ser. No. 167,357

4 Claims. (Cl. 148—179)

Figures 1A, 1C, 1D, 1E, 1F:
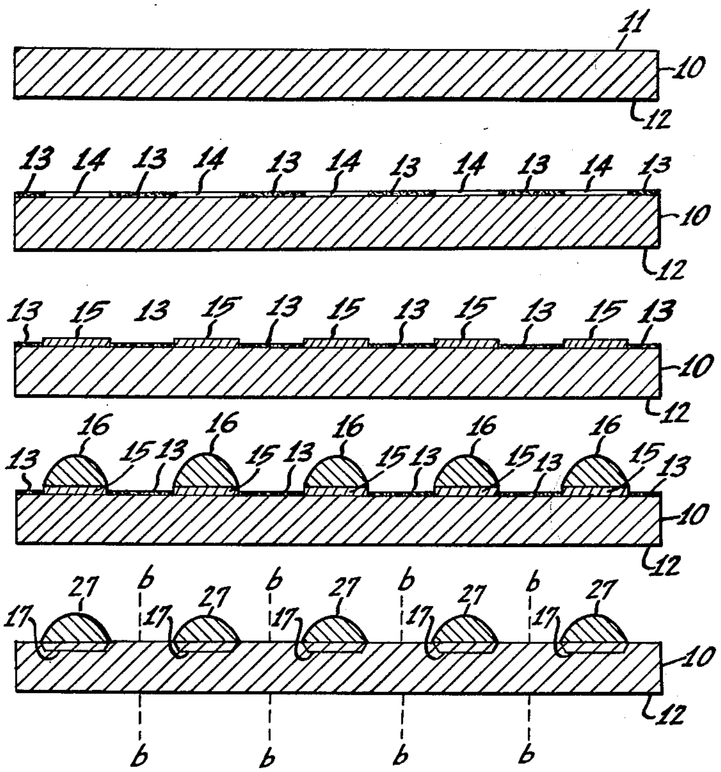

This invention relates to improved methods of fabricating improved semiconductor junction devices.

One method of fabricating semiconductor junction devices is to prepare a given conductivity type wafer of a suitable crystalline semiconductive material, for example N-type germanium. A mass or dot of material which consists of or contains a substance (known as an impurity or a conductivity type modifier or a doping agent) that induces opposite conductivity type in the particular semiconductive material is then positioned on one face of the wafer. When the wafer is N-type germanium, the mass or dot may suitably consist of indium. The assemblage of semiconductive wafer and impurity dot is then heated to a temperature above the melting point of the impurity dot. The dot melts and dissolves a portion of the wafer. On cooling, the dissolved wafer material precipitates from the melt and resolidifies on the wafer, as an extension of the original crystal lattice. This resolidified wafer material contains a sufficient amount of the modifier or doping agent (indium in this example) to be of opposite conductivity type, that is, P-type in this example. A rectifying barrier known as a PN junction is thus formed at the boundary between hte P-type resolidified region and the original N-type bulk of the wafer.

While this method of making semiconductor junction devices has been very widely and successfully used, for example in the fabrication of surface alloyed or fused germanium PNP transistors, improvement is desirable in several important respects. First, the positioning of the dots on the semiconductive wafers requires considerable hand labor and inspection, particularly for small devices, thus raising the cost of the finished product. Second, although the method is relatively easy to perform with P-type pellets or dots on N-type semiconductive wafers, it is very difficult to accomplish with N-type pellets or dots on P-type wafers of semiconductive materials such as germanium. One reason for this is that substances such as indium and indium alloys which are suitable acceptors in germanium are ductile and easy to handle. In contrast, the materials which act as donors, for example phosphorus, arsenic and antimony, are very brittle and difficult to handle. Third, small variations in the size and shape and positioning of the dots on the wafers result in undesirable variations in the electrical characteristics of the completed devices.

It is therefore an object of this invention to provide an improved method of fabricating improved semiconductor devices.

Another object of the invention is to provide an improved method of introducing a conductivity type modifier into a crystalline semiconductive body.

Still another object is to provide an improved inexpensive method of forming rectifying barriers in a crystalline semiconductive body.

Yet another object is to provide an improved method of introducing a modifier into a predetermined portion of a crystalline semiconductive body so as to obtain reproducible PN junctions in mass production.

These and other objects are accomplished by the method of the instant invention, which comprises preparing a given conductivity type crystalline semiconductive wafer. A thin coating of a modifier is then deposited on a surface opposite conductivity type in the wafer, and the solvent of said wafer. A layer of a solvent metal is deposited on the coating. The modifier is one capable of inducing metal is one capable of dissolving both the modifier and the wafer material. The wafer thus prepared and coated is heated so as to alloy the modifier and the solvent metal to the predetermined portion of the wafer.

The invention will be described in greater detail by reference to the accompanying drawing, in which the single figure illustrates successive steps in the fabrication of a semiconductor junction device made in accordance with the present invention.

A preferred example of the method will illustrate the preparation of a single-junction semiconductor device of the diode type. However, it is to be understood that the method is equally applicable to making multiple junction devices such as transistors, and that the end product need not necessarily be a diode.

*Example*

Referring to FIGURE 1*a*, a wafer 10 of semiconductive material is prepared by conventional methods so as to have two opposing major faces 11 and 12. For example, a crystalline ingot is formed of highly purified semiconductive material, and the ingot is cut into transverse slices. The slices may be first diced and subsequently processed, or, as in this example, may be treated to form a plurality of units before it is diced. In this example, wafer 10 is a lapped slice of monocrystalline P-type germanium about 7 to 8 mils thick, and contains sufficient indium to have a resistivity in the range of .18 to .26 ohm-centimeters. Wafer 10 is dipped into a mild etchant for ten seconds so as to remove surface contamination. A suitable etchant consists of six ml. nitric acid, three ml. acetic acid, one ml. hydrofluoric acid, and one drop of potassium iodide solution.

When fast-acting diodes are to be produced, the minority carrier lifetime of the semiconductor wafer 10 may be reduced by the addition of a suitable impurity such as gold to the semiconductor. In this example, a flash (not shown) of 99.9% pure gold is evaporated in a vacuum of not less than $6\times10^{-5}$ mm. Hg on one major face 11 of wafer 10. Wafer 10 is then heated to 850° C. for 10 hours so that the gold diffuses into the wafer. Wafer 10 is next etched to a thickness of 2.3 plus or minus .3 mil.

Figure 1B:
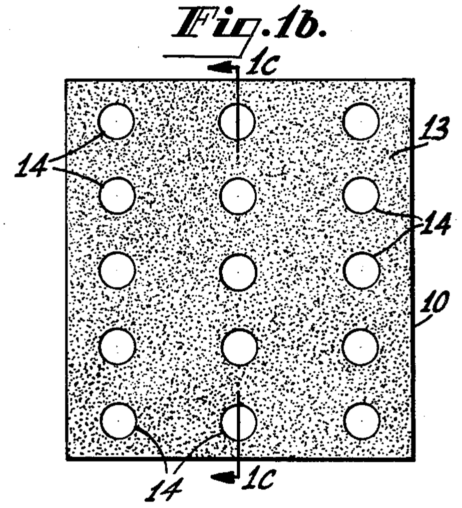
Figure 1G:
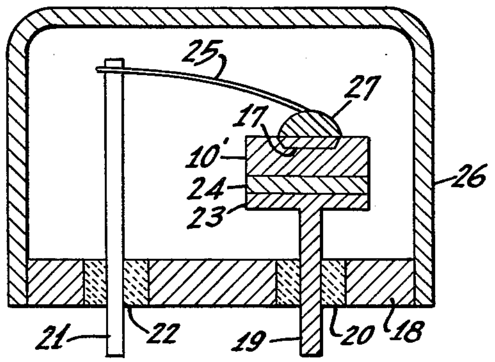

Now predetermined areas of one major wafer face (11 in this example) are suitably masked. This may conveniently be accomplished by coating wafer face 11 with a photoresist 13 and shining ultraviolet light through a suitably patterned photographic glass plate on the photoresist coating. The photoresist may consist of a bichromated protein, such as albumen or gum arabic or gelatin. Commercially available photoresists may also be utilized. The photoresist is then developed, and those portions of the photoresist which were not exposed to the ultraviolet light are washed away. FIGURE 1*b* shows a plan view and FIGURE 1*c* a cross-sectional view of wafer 10 after this step. FIGURES 1*a* and 1*c*–1*f* are sectional views along the line **1*c*—1*c*** in FIGURE 1*b*. The uncoated areas 14 of wafer face 11 in this example are circles 5 mils in diameter spaced 32 mils from center to center.

The wafer thus masked with photoresist coating 13 is cleaned by immersion in 50% hydrochloric acid, washed in cold water, and then made the cathode of a plating bath (not shown). The plating solution consists of 284 ml. ethylene glycol, 7.1 ml. concentrated hydrochloric acid, 14.2 grams antimony fluoborate and 709 ml. deionized water. With the plating solution at room temperature, and a plating potential of about one volt applied between the wafer and a carbon anode in the bath, a period of about 20 seconds is sufficient to deposit a flash or thin coating of antimony 15 (FIGURE 1*d*) on the unmasked areas 14 of wafer face 11. Since antimony is a donor in germanium, it is capable of inducing in the wafer, conductivity (N-type) opposite to that of the original conductivity of the wafer (P-type). The relative thickness of the photoresist coating 13 and the antimony coating 15 and the wafer 10 are not to scale in the drawing having been exaggerated for greater clarity.

Wafer 10 is not rinsed in cold tap water for about 20 seconds and a layer of a solvent metal is deposited on the antimony coated areas 15. A suitable solvent metal for both germanium and antimony is lead. The solvent metal may be deposited by any convenient technique. In this example, lead is deposited on the antimony coated areas 15 by a second plating step. Wafer 10 is made the cathode of another plating bath (not shown). The plating solution now utilized consists of 200 grams lead fluoborate and 0.2 gram peptone per liter of water. The plating solution is kept at room temperature and a current of one ampere is passed between the wafer and a lead anode for about 110 minutes. A heavy lead coating 16 is thus formed over the antimony coating 15, as illustrated in FIGURE 1*e*.

The coated wafer is washed in cold water, rinsed in methanol, dried, and then heated to alloy the lead and antimony coatings to the wafer. Alloying is preferably performed by a two-stage solder-down alloy-in process, as described in U.S. Patent 2,932,594, issued April 12, 1960 to C. W. Mueller and assigned to the assignee of this application. The wafer is first heated to a temperature of about 550° C. for about one minute in a slightly oxidizing ambient such as line hydrogen. During this step the remaining portions 13 of the photoresist are burned off. Advantageously, excess spreading of the lead and antimony during the alloying step is minimized by coating the wafer with in inert film prior to the alloying step. The film may consist of silicon dioxide, as described in U.S. Patent 2,796,562, issued June 18, 1957, to S. G. Ellis et al., and assigned to the assignee of this application. Alternatively, magnesium hydroxide may be utilized for this purpose, as described in U.S. Patent 2,805,968. issued September 10, 1957, to G. E. Dunn, Jr., and assigned to the assignee of this application. The wafer is then cooled to room temperature, and reheated in a reducing ambient such as forming gas for about 25 minutes at about 780° C. The modifier (in this example, the antimony deposits 15) and the solvent metal (in this example, the lead deposits 16) are melted, and each mass of molten lead-antimony alloy thus formed dissolves some of the material (germanium in this example) of wafer 10. On cooling, the dissolved germanium precipitates from the melt and resolidifies as a part of the original crystalline lattice of wafer 10. The molten lead-antimony alloy masses next freeze in a characteristic hemispheric-shape and alloy to wafer 10 as metallic buttons 27 (FIGURE 1*f*), each button 27 being in direct contact with a resolidified region in the wafer. These resolidified regions are very thin, and are not shown. The resolidified germanium contains a sufficient amount of the modifier (antimony in this example) to be converted to N-type conductivity. A rectifying barrier 17 known as a PN junction is thus formed at or immediately in front of the boundary between each N-type resolidified region in the wafer and the P-type bulk of the wafer.

The wafer 10 is now diced into individual pellets or dies by cutting along the planes *b—b*, and planes perpendicular to these planes. The cuts are made so that each die includes one metallic button 27 and one PN junction 17. The individual dies are then mounted and cased by any convenient technique known to the art. For example, a steel header 18 is prepared with two electrically insulating inserts 20 and 22, which may suitably consist of glass. A first metallic pin 19 extends through insulating insert

20, and a second metallic pin 21 extends through insert 22. One pin 19 is shaped like a nail, and bears on one end a flat nailhead 23. A die 10′ prepared as described above is mounted on nailhead 23 of pin 19 so that the metallic button 27 of the die is uppermost. The die may be bonded to the nailhead by soldering. In this example, a solder disk 24 is positioned between nailhead 23 and die 10′. Since die 10′ consists of p-type germanium in this example, a suitable solder-disk consists of indium, and is about 2 mils thick. The assemblage is heated to about 500° C. in order to solder die 10′ to nailhead 23. A connector wire 25 is welded at one end to pin 21 and at the other end is attached to the metallic button 27 on die 10′. The die 10′ is then enclosed by means of a steel can 26 open at one end, which is forced over header 18 and sealed thereto by means of an interference fit, as described in U.S. Patent 2,965,962, issued December 27, 1960 to J. Ollendorf et al., and assigned to the assignee of this application. If desired, a plurality of units may be mounted within a single case.

A feature of this method is that the amount of hand labor required per unit is reduced, thus lowering the cost of the finished product.

Another feature of this method is that it is suitable for mass production techniques, since large numbers of junction devices may be processed simultaneously.

Still another advantage of this invention is that the amount of the modifier in the alloyed button 27 of solvent metal plus modifier can be maintained within fairly close limits, as can the size of the alloyed button. As a result, the electrical characteristics of the completed junction devices have been found to be uniform and reproducible.

It will be understood that the above example is by way of illustration only and not limitation, since various modifications may be made without departing from the spirit and scope of the invention. For example, although the plating techniques described above are particularly convenient, the modifier and solvent metal may be deposited on the semiconductive wafer by other methods, such as evaporation, or deposited as a paste by printing or silk screening techniques. Instead of photoresist, materials such as paraffin wax, apiezon wax, or, stopoff lacquers or other nonconductive adhesive coatings may be utilized to mask the semiconductive wafer. Other crystalline semiconductors may be utilized with appropriate modifiers and solvent metals. For example, the wafer may consist of silicon or silicon-germanium alloys, and the solvent metal may consist of tin or tin-lead alloys. The conductivity types of the various device regions may be reversed. For example, when an N-type germanium or silicon wafer is utilized, the modifier deposited on the wafer is one which is an acceptor in these semiconductors, such as indium or gallium or aluminum or combinations thereof. When an N-type compound semiconductor such as gallium arsenide or indium phosphide is utilized, a suitable acceptor is zinc or cadmium.

There have thus been described improved methods of fabricating improved semiconductor devices.

What is claimed is:

1. The method of fabricating a semiconductor device comprising the steps of preparing a given conductivity type crystalline semiconductive wafer with two opposing major faces; plating over at least one restricted area on at least one said major wafer face a thin coating of a modifier capable of inducing opposite conductivity type in said wafer; plating on said coating a layer of a solvent metal; and heating said wafer to alloy said modifier and said solvent metal to said wafer.

2. The method of fabricating a semiconductive device comprising the steps of preparing a given conductivity type crystalline semiconductive wafer with two opposing major faces; masking at least a portion of one said major wafer face; plating on the unmasked portion of said wafer face a modifier capable of inducing opposite conductivity type in said wafer; plating on said modifier a layer of a solvent metal; and heating said wafer to alloy said modifier and said solvent metal to said wafer.

3. The method of fabricating a semiconductor device comprising the steps of preparing a P-type monocrystalline germanium wafer with two opposing major faces; masking both said major faces; plating antimony on the unmasked portions of said wafer faces; plating lead over said antimony plated portions on said wafer; and heating said wafer to alloy said antimony and said lead to said wafer.

4. The method of fabricating a semiconductor device comprising the steps of preparing a given conductivity type mono-crystalline semiconductive wafer with two opposing major faces; masking at least one face of said wafer so as to expose a plurality of unmasked areas on said face; plating over said unmasked areas a thin coating of a modifier capable of inducing opposite conductivity type in said wafer; plating on said coated areas a layer of a solvent metal; heating said wafer to alloy said modifier and said solvent metal to said unmasked areas of said wafer face; and dividing said wafer into a plurality of individual units, each unit including at least one of said plated areas.

References Cited by the Examiner

UNITED STATES PATENTS

| | | | |
|---|---|---|---|
| 2,742,383 | 4/56 | Barnes | 148—33 |
| 2,781,481 | 2/57 | Armstrong | 148—1.5 |
| 2,821,493 | 1/58 | Carman | 148—1.5 |
| 2,930,948 | 3/60 | Eannarino | 148—33 |
| 2,944,321 | 7/60 | Westberg | 148—1.5 |
| 2,986,481 | 5/61 | Gudmundsen | 148—1.5 |

OTHER REFERENCES

J. C. Marinace, "Semiconductor Fabrication," IBM Technical Disclosure Bulletin, vol. 3, No. 4, September 1960, page 42.

DAVID L. RECK, *Primary Examiner.*

WINSTON A. DOUGLAS, *Examiner.*

UNITED STATES PATENT OFFICE

CERTIFICATE OF CORRECTION

Patent No. 3,188,251 June 8, 1965

Ronald A. Straight et al.

It is hereby certified that error appears in the above numbered patent requiring correction and that the said Letters Patent should read as corrected below.

Column 2, lines 2 and 3, strike out "of said wafer. A layer of a solvent metal is deposited on the coating. The modifier is one capable of inducing" and insert the same after "surface" in column 1, line 71; column 3, line 11, for "not" read -- now --.

Signed and sealed this 7th day of December 1965.

SEAL)
test:

RNEST W. SWIDER
testing Officer

EDWARD J. BRENNER
Commissioner of Patents